US006471882B1

(12) United States Patent
Namikawa et al.

(10) Patent No.: US 6,471,882 B1
(45) Date of Patent: Oct. 29, 2002

(54) PROCESS FOR PRODUCING HEAD SLIDER

(75) Inventors: Makoto Namikawa, Ibaraki (JP); Haruo Ioka, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/574,803

(22) Filed: May 19, 2000

(30) Foreign Application Priority Data

May 21, 1999 (JP) ............................................ 11-141186

(51) Int. Cl.⁷ ............................................... B32B 35/00
(52) U.S. Cl. ............................. 216/43; 156/84; 156/85; 156/247; 156/275.5; 156/344; 216/42
(58) Field of Search .................................. 156/344, 230, 156/234, 235, 241, 275.5, 275.7, 247, 584, 84, 85; 216/41, 42, 43, 48

(56) References Cited

U.S. PATENT DOCUMENTS

| 5,466,325 | A | | 11/1995 | Mizuno et al. |
| 5,959,011 | A | * | 9/1999 | Mizuno et al. ............. 524/306 |
| 6,245,188 | B1 | * | 6/2001 | Toyoda et al. .............. 156/247 |

* cited by examiner

*Primary Examiner*—Richard Crispino
*Assistant Examiner*—Cheryl N. Hawkins
(74) *Attorney, Agent, or Firm*—Knobbe Martens Olson & Bear LLP

(57) ABSTRACT

A process for producing a head slider wherein a floating surface is formed on a slider substrate by photolithography. The process for the production of a head slider has a step of forming, on a slider substrate by photolithography, a patterned floating surface having a resist material on its upper surface; a step of sticking an adhesive sheet on the upper surface of the resist material present on the floating surface; and a step of peeling off the adhesive sheet together with the resist material from the floating surface.

6 Claims, No Drawings

PROCESS FOR PRODUCING HEAD SLIDER

FIELD OF THE INVENTION

The present invention relates to a process for producing a head slider, and more particularly to a process for producing a head slider by simply and surely removing a resist material present on a floating surface which is formed on a slider substrate.

BACKGROUND OF THE INVENTION

A floating head slider used in HDD (hard disc drive) has been required to maintain a low, constant floating height as the density of HDD has increased. Therefore, complicated uneven portions are formed on its floating surface by etching by using a resist material as a mask. As a difference in level in the uneven portions has increased in recent years, a dry film resist having a thickness of several tens $\mu$m is being used as a resist material.

In order to form a shape of a predetermined pattern on a floating surface, a dry film resist is first stuck onto a slider substrate and shaped into the predetermined pattern by the conventional photolithography. Next, the substrate in the area where no resist material is present is removed by etching by applying Ar ions or the like using the resist pattern as a mask, thereby forming the predetermined pattern on the floating surface of the slider substrate.

A resist mask which has already become unnecessary is present on the thus formed floating surface and it is removed prior to the next step. Heretofore, swelling treatment using an organic solvent such as acetone has been adopted as a method for removing such a resist mask.

However, the swelling treatment using the organic solvent has a problem that the resist material which has been peeled off from the substrate drifts in the solvent and redeposits onto the substrate. There is also another problem of the risk of fire, deterioration of a working environment, or the like.

SUMMARY OF THE INVENTION

The object of the present invention is, in the light of these circumstances, to provide a process for producing a head slider, the process being able to simply and surely remove, during the production of the head slider by photolithography, a resist material present on a floating surface which has already become unnecessary.

The present inventors have intensively studied in order to attain the above object. As a result, they have found that in the formation of a floating surface on a slider substrate by photolithography, sticking an adhesive sheet onto the upper surface of a resist material present on the floating surface, followed by peeling off the adhesive sheet together with the resist material from the floating surface allows the resist material to be simply and surely removed from the floating surface and the aforementioned problems such as the deterioration of the environment can be solved at one stroke, and have accomplished the present invention.

That is, the present invention includes:

1. A process for producing a head slider, the process comprising:
   a step of forming, on a slider substrate by photolithography, a patterned floating surface having a resist material on its upper surface;
   a step of sticking an adhesive sheet on the upper surface of the resist material present on the floating surface; and
   a step of peeling off the adhesive sheet together with the resist material from the floating surface;

2. The process for producing a head slider according to the item 1, wherein the slider substrate and the resist material are heated to make a condition where a modulus of elasticity of the resist material is lowered at least during the step of peeling off the adhesive sheet;

3. The process for producing a head slider according to the item 2, wherein the step of sticking the adhesive sheet is conducted under a condition where the slider substrate and the resist material have been heated in advance and the step of peeling off the adhesive sheet is conducted while the heated condition is maintained;

4. The process for producing a head slider according to the item 2, wherein the slider substrate and the resist material are heated after the step of sticking the adhesive sheet and the step of peeling off the adhesive sheet is conducted while the heated condition is maintained;

5. The process for producing a head slider according to items 2, 3 or 4, wherein a temperature under the heated condition is in the range of from 40 to 150° C.;

6. The process for producing a head slider according to the item 1, wherein the adhesive used for the adhesive sheet is a curable pressure-sensitive adhesive; and 7. The process for producing a head slider according to the item 6, wherein the curable pressure-sensitive adhesive is an ultraviolet-curable adhesive and an ultraviolet irradiation step is conducted after the step of sticking the adhesive sheet and before the step of peeling off the adhesive sheet.

DETAILED DESCRIPTION OF THE INVENTION

In the process for producing a head slider according to the present invention, a typical example of the step of forming, on a slider substrate by photolithography, a patterned floating surface having a resist material on its upper surface is a method in which, as previously mentioned, a dry film resist material is stuck onto the slider substrate, a predetermined resist pattern is formed by the conventional photolithography, and the substrate in the area where no resist material is present is removed by etching by applying Ar ions or the like using the resist pattern as a mask.

The resist material on the floating surface, as mentioned above, was shaped into a predetermined pattern on the substrate and remains on the substrate as a resist mask after etching.

The thickness of the remaining resist material is generally set to be approximately from 1 to 20 $\mu$m, for example, in the case of the irradiation with Ar ions, but is not limited to this.

In the process for producing a head slider according to the present invention, an adhesive sheet is stuck onto the upper surface of such a resist material present on such a floating surface of the slider substrate. The adhesive sheet used here is an item prepared by providing a pressure-sensitive adhesive layer generally having a thickness of from 20 to 150 $\mu$m on a film substrate and forming them into a sheet or a tape. The film substrate is exemplified by films of plastic such as polyester, polycarbonate, polyethylene, polypropylene, polyamide and acetylcellulose. Preferred thickness of the film substrate is generally from 10 to 1000 $\mu$m.

The pressure-sensitive adhesive layer may be one using conventional non-curable pressure-sensitive adhesives of the acrylic type, the rubber type and the like, preferred is one using curable pressure-sensitive adhesive in order to remove the resist material more cleanly and to prevent adhesive deposit and the like.

Such a curable pressure-sensitive adhesive is not particularly limited in its material and the like as long as it has the property of being cured by an activation energy source so that its molecular structure is transformed into three-dimensional cross linkage. Preferred examples thereof those of a polymerization-curable type comprising a pressure-sensitive adhesive polymer, a curable compound having at least one unsaturated double bond in the molecule and a polymerization catalyst.

Examples of such a pressure-sensitive adhesive polymer include acrylic polymers containing, as a main monomer, (meth)acrylic acid and/or (meth)acrylic ester selected from acrylic acid, acrylic ester, methacrylic acid and methacrylic ester. In the synthesis of the acrylic polymers, it is also possible to make the acrylic polymer itself participate in the polymerizing and curing reaction by an activation energy by means of introducing an unsaturated double bond into the molecule of the acrylic polymer, for example, by using, as a copolymerizing monomer, a compound having two or more unsaturated double bonds in the molecule or by making a chemical bond, by a reaction between functional groups, a compound having an unsaturated double bond in the molecule and the acrylic polymer synthesized.

Preferred examples of the curable compound having at least one unsaturated double bond in the molecule include those having low molecular weights which are nonvolatile and have weight average molecular weights of not greater than 10000. In particular, preferred are those having molecular weights of not greater than 5000 so that the formation of the three-dimensional cross linkage in the layer of the curable pressure-sensitive adhesive during curing efficiently proceeds. Specific examples thereof include urethane (meth)acrylate, oligoester (meth)acrylate, epoxy (meth)acrylate, polyethylene glycol di(meth)acrylate and trimethylolpropane (meth)acrylate.

The polymerization catalyst to be added to the curable pressure-sensitive adhesive is not particularly limited and known ones can be employed. Examples thereof include thermal polymerization initiators such as benzoyl peroxide and azobisisobutyronitrile for the case of using heat as the activation energy source, and photopolymerization initiators such as benzoin, benzoin ethyl ether, dibenzyl, isopropyl benzoin ether, benzopheneone, Michler's ketone chlorothioxanthone, dodecylthioxanthone, dimethylthioxanthone, acetophenone diethyl ketal, benzyl dimethyl ketal, $\alpha$-hydroxycyclohexylphenylketone, 2-hydroxydimethylphenylpropane and 2,2-dimethoxy-2-phenylacetophenone for the case of using light.

Examples of the activation energy source to be used for curing the curable pressure-sensitive adhesive include ultraviolet rays and heat. From the viewpoint of prevention of false operation caused by unintended external heating, the ultraviolet rays are preferred.

In the process for producing a head slider according to the present invention, the adhesive sheet is stuck onto the upper surface of the resist material present on the floating surface of the slider substrate as mentioned above and thereafter the adhesive sheet is peeled off. When the adhesive sheet is made of a curable pressure-sensitive adhesive, the adhesive sheet is stuck, then subjected to predetermined curing treatment, and thereafter peeled. By the peeling of the adhesive sheet, the resist material integrated with the adhesive sheet is removed from the floating surface with the adhesive sheet, thereby yielding a slider head.

In the process for producing a head slider, it is preferable that the adhesive sheet is peeled off under a condition where the modulus of elasticity of the resist material is reduced by heating the slider substrate and the resist material at least when the adhesive sheet is peeled off.

Concretely speaking, there can be mentioned a method in which the adhesive sheet is stuck under a condition where the slider substrate and the resist material have been heated in advance and the adhesive sheet is peeled off while the heated condition is maintained and a method in which the adhesive sheet is stuck, then the slider substrate and the resist material are heated, and the adhesive sheet is then peeled off while the heated condition is maintained.

In these methods, to maintain the heated condition of the slider substrate and the resist material means that the surface temperatures of the slider substrate and the resist material are in the predetermined ranges.

In these methods, the surface temperatures of the slider substrate and the resist material are, in general, from 40 to 150° C. Their surface temperatures are preferably from 45 to 120° C.

When the temperatures are too low, the modulus of elasticity of the resist material is difficult to be lowered. In contrast, when the temperatures are too high, the degradation of the resist material and the deterioration of a film substrate in the adhesive sheet are caused. In the both cases, it is sometimes difficult to achieve satisfactory results with respect to the efficiency of removing the resist material.

When the modulus of elasticity of the resist material is reduced is made by such heating, the adhesive strength of the resist material to the slider substrate is relieved and the adhesiveness of the resist material to the surface of the slider substrate becomes worse. When the resist material is in such a condition where its modulus of elasticity has been reduced, the resist material can be easily removed from the slider substrate by peeling off the adhesive sheet which had been stuck to the resist material. At this time, satisfactory efficiency of removing the resist material can be surely achieved regardless of the thickness, the characteristics and the like of the resist material.

EXAMPLES

The present invention is explained based on the following examples, but the invention is not limited to the examples. In the following description, "parts" means "parts by weight".

Example 1

In accordance with the conventional method, a resist pattern was formed by sticking a 7-$\mu$m-thick dry resist film of a negative type onto a floating surface of a 100-mm-square $Al_2O_3$—TiC slider substrate and conducting usual heating, exposure and development. Using the resist pattern as a mask, the $Al_2O_3$—TiC layer present in the area where no resist material was present was removed by etching by applying Ar ions to form a floating head slider of a predetermined pattern. An unnecessary resist mask made of the foregoing resist material is present on the floating surface of the floating head slider.

In the next step, the entire slider substrate, which had the floating surface with the unnecessary resist mask, was heated to 100° C. While the heated condition was maintained, an adhesive sheet prepared by providing a 35-$\mu$m-thick ultraviolet-curable pressure-sensitive adhesive layer on a film substrate composed of a 50-$\mu$m-thick polyester film was stuck onto the surface on which the resist mask was present. The sticking conditions were set to a pressure of 10 kg/cm² and a sticking rate of 10 mm/second. For the formation of the ultraviolet-curable pressure-sensitive adhesive layer was used an ultraviolet-curable pressure-sensitive adhesive solution prepared by mixing, with a solution of an acrylic polymer having a weight average molecular weight of 500,000 composed of n-butyl acrylate as a main monomer, 37.5 parts of urethane acrylate and 3 parts of multi-functional isocyanate compound acrylate as curable compounds and 3 parts of benzyl dimethyl ketal as a photopolymerization initiator, based on 100 parts of the acrylic polymer.

Subsequent to sticking the adhesive sheet as mentioned above, the adhesive sheet was cured by applying ultraviolet rays of a central wave length of 365 nm so that an integrated quantity of light became 1000 mW/cm² while the heated condition at 100° C. was maintained. After curing followed by cooling to 50° C., the adhesive sheet was peeled off at a peeling rate of 30 mm/second under the heated condition to allow the resist mask to be peeled and removed together with the adhesive sheet and a floating head slider in which a floating surface had been formed on the slider substrate was obtained. After this peeling operation, the observation of the surface of the slider substrate using an optical microscope of a magnification of 100 times found no residue of resist and no adhesive deposit.

Example 2

The sticking of an adhesive sheet was conducted in the same manner as in Example 1 except that the entire slider substrate was not heated. The entire slider substrate was subsequently heated to 100° C., and while this heated condition was maintained, the adhesive sheet was cured by applying ultraviolet rays under the same conditions as in Example 1. Subsequent to this, the matter was cooled to 50° C. and while this heated condition was maintained the adhesive sheet was peeled off under the same condition as in Example 1 to yield a floating head slider in which a floating surface had been formed on the slider substrate. The observation of the surface of the slider substrate using an optical microscope of a magnification of 100 times found no residue of resist and no adhesive deposit.

As mentioned above, according to the present invention, an unnecessary resist material present on a floating surface of a slider substrate can be simply and surely peeled and removed without deteriorating the working environment by using an adhesive sheet in the production of a head slider. Moreover, the efficiency of peeling and removing the resist material can be enhanced by making the condition where the modulus of elasticity of the resist material is lowered by heating the slider substrate and the resist material at least when the adhesive sheet is peeled off. Accordingly, the present invention has an effect that the resist material can be simply and surely removed regardless its thickness, characteristics or the like and a head slider can be efficiently produced.

What is claimed is:

1. A process for producing a head slider, comprising:

placing a dry film resist material on a slider substrate;

forming, on the slider substrate, a patterned floating surface by removing the resist material in a pattern by photolithography;

adhering a curable pressure-sensitive adhesive formed on a sheet to the floating surface including the remaining resist material;

curing the adhesive;

heating the remaining resist to lower elasticity of the resist material; and peeling the adhesive sheet together with the resist material while maintaining a temperature of the resist material for lowering its elasticity, from the floating surface.

2. The process for producing a head slider according to claim 1, wherein the temperature in the heating step to lower elasticity of the resist material is in the range of from 40 to 150° C.

3. The process for producing a head slider according to claim 1, wherein the curable pressure-sensitive adhesive is an ultraviolet-curable adhesive and an ultraviolet irradiation step is conducted after the step of sticking the adhesive sheet and before the step of peeling off the adhesive sheet.

4. The process according to claim 1, wherein the heating step is initiated prior to the adhesion step or the curing step and continues through the peeling step.

5. The process according to claim 1, wherein the temperature in the peeling step is maintained at 40° C. or higher.

6. A process for producing a head slider, comprising:

forming, on a slider substrate, a patterned floating surface by removing a resist material formed thereon in a pattern by photolithography;

adhering an adhesive sheet on the floating surface;

heating the resist material remaining on the slider substrate at a temperature of 40–120° C. to lower elasticity of the resist material; and peeling the adhesive sheet together with the resist material while maintaining the temperature of the resist material for lowering its elasticity, from the floating surface.

* * * * *